United States Patent
Wang et al.

(10) Patent No.: US 11,474,434 B2
(45) Date of Patent: Oct. 18, 2022

(54) MASK AND METHOD FOR MANUFACTURING THE SAME, LITHOGRAPHY METHOD, DISPLAY PANEL, DISPLAY DEVICE AND EXPOSURE DEVICE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Dengfeng Wang, Beijing (CN); Zhou Rui, Beijing (CN); Maoxiu Zhou, Beijing (CN); Haipeng Yang, Beijing (CN); Lei Guo, Beijing (CN); Lin Chen, Beijing (CN)

(73) Assignees: HEFEI XINSHENG OPTOELECTRONICS TECHNOLOGY CO., LTD., Anhui (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 280 days.

(21) Appl. No.: 16/825,584

(22) Filed: Mar. 20, 2020

(65) Prior Publication Data
US 2021/0096470 A1      Apr. 1, 2021

(30) Foreign Application Priority Data
Sep. 26, 2019  (CN) .......................... 201910917191.0

(51) Int. Cl.
*G03F 7/20*       (2006.01)
*G02F 1/1343*    (2006.01)
(Continued)

(52) U.S. Cl.
CPC ...... *G03F 7/70191* (2013.01); *G02F 1/13439* (2013.01); *G02F 1/136286* (2013.01); *G03F 1/38* (2013.01); *G03F 7/004* (2013.01); *G03F 7/70125* (2013.01); *G03F 7/70466* (2013.01); *G03F 7/70575* (2013.01);
(Continued)

(58) Field of Classification Search
CPC .................. A63J 5/025; G02F 1/13439; G02F 1/136286; G02F 2201/121; G02F 2201/123; G02F 2201/124; G02F 1/134372; G02F 1/136218; G03F 7/70191; G03F 1/38; G03F 7/004; G03F 7/2004; G03F 7/70125; G03F 7/70466; G03F 7/70575; H01L 27/124
See application file for complete search history.

(56) References Cited

U.S. PATENT DOCUMENTS

| | | | | |
|---|---|---|---|---|
| 11,002,893 | B2 * | 5/2021 | Marutani | ............... H01S 5/4062 |
| 2008/0003529 | A1 * | 1/2008 | Ootake | .................. G03F 7/0397 |
| | | | | 430/327 |
| 2017/0269467 | A1 * | 9/2017 | Zhang | ....................... G03F 7/26 |

* cited by examiner

*Primary Examiner* — Deoram Persaud
(74) *Attorney, Agent, or Firm* — Kinney & Lange, P.A.

(57) ABSTRACT

A mask is provided in embodiments of the disclosure, at least including: a first light transmission area provided with a first optical filter film; and a second light transmission area provided with a second optical filter film; the first optical filter film and the second optical filter film comprise respective materials through which light of different frequency ranges is optically filtered, respectively. A method for manufacturing a mask, a lithography method, a display panel, a display device, and an exposure device are further provided in embodiments of the disclosure.

15 Claims, 7 Drawing Sheets

(51) Int. Cl.
  *G02F 1/1362*  (2006.01)
  *H01L 27/12*  (2006.01)
  *G03F 7/004*  (2006.01)
  *G03F 1/38*  (2012.01)
(52) U.S. Cl.
  CPC ...... *H01L 27/124* (2013.01); *G02F 1/136218* (2021.01); *G02F 2201/121* (2013.01); *G02F 2201/123* (2013.01); *G02F 2201/124* (2013.01); *G03F 7/2004* (2013.01)

MASK AND METHOD FOR MANUFACTURING THE SAME, LITHOGRAPHY METHOD, DISPLAY PANEL, DISPLAY DEVICE AND EXPOSURE DEVICE

CROSS-REFERENCE TO RELATED APPLICATION

The present application claims the benefit of Chinese Patent Application Invention No. 201910917191.0 filed on Sep. 26, 2019 in the State Intellectual Property Office of China, the whole disclosure of which is incorporated herein by reference.

BACKGROUND

Technical Field

Embodiments of the present disclosure generally relate to the technical field of display technology, and in particular, to a mask and a method for manufacturing the same, a lithography method, a display panel, a display device, and an exposure device.

Description of the Related Art

As to a liquid crystal display, in processes of manufacturing both an array substrate and a color filter substrate thereof, a lithography process is used. After a photoresist (PR) is coated, UV light is used to irradiate the photoresist with a mask; and then, a development process on the photoresist follows an exposure process; next, after the exposure process, then an illuminated portion of the photoresist is removed with an alkaline solution so as to form a pattern of the photoresist corresponding to the mask. Using the pattern of the photoresist as a mask, a substrate material is etched, so as to realize a transfer of the pattern of the mask to the substrate.

In a practical production, a resolution of an exposure machine is determined once a panel factory is built, which may not be readily changed; for example, in a condition that an accuracy of the exposure machine is 3 μm, it is difficult to further reduce the accuracy. The resolution is restricted by intrinsic/inherent defects of exposure accuracy of the apparatus, although the resolution can be improved by enhancing exposure technology such as phase shift compensation and the like, the space for improvement is limited.

SUMMARY

The embodiments of the present disclosure have been made to overcome or alleviate at least one aspect of the above mentioned disadvantages and/or shortcomings in the prior art, by providing a mask and a method for manufacturing the same, a lithography method, a display panel, a display device, and an exposure device.

Following technical solutions are adopted in exemplary embodiments of the invention.

According to one aspect of embodiments of the disclosure, there is provided a mask, at least comprising:

a first light transmission area provided with a first optical filter film; and a second light transmission area provided with a second optical filter film;

wherein, the first optical filter film and the second optical filter film comprise respective materials through which light of different frequency ranges is optically filtered, respectively.

According to an exemplary embodiment of the present disclosure, sections of the first light transmission area and sections of the second light transmission area are arranged to alternate with each other.

According to an exemplary embodiment of the present disclosure, each of the first light transmission area and the second light transmission area has a comb-shaped portion.

According to an exemplary embodiment of the present disclosure, each of the first optical filter film and the second optical filter film is one of a semi transmission film and a selective transmission film.

According to a second aspect of embodiments of the disclosure, there is provided a method for manufacturing a mask, comprising:

forming a first light transmission area and a second light transmission area on a mask substrate;

forming a first optical filter film in the first light transmission area;

forming a second optical filter film in the second light transmission area, wherein the first optical filter film and the second optical filter film comprise respective materials through which light of different frequency ranges is optically filtered, respectively.

According to an exemplary embodiment of the present disclosure, at least one of forming a first optical filter film in the first light transmission area and forming a second optical filter film in the second light transmission area comprises:

coating an optical filter material on the mask substrate; and removing a portion of the optical filter material in a non-target area and reserving a portion of the optical filter material in a target area;

wherein the target area occupies an area coverage corresponding to the first light transmission area or the second light transmission area According to a third aspect of embodiments of the disclosure, there is provided a lithography method using the mask as above, comprising:

coating a photoresist on an object to be processed by lithography;

placing the mask by aligning it with the object to be processed by lithography;

exposing the photoresist with a first light having a first frequency through the mask;

and exposing the photoresist with a second light having a second frequency through the mask;

wherein in the mask, merely the first optical filter film is permeable to the first light having the first frequency, and merely the second optical filter film is permeable to the second light having the second frequency.

According to an exemplary embodiment of the present disclosure, the photoresist comprises a first resin having a structure as below:

(I)

In formula (I), Xa represents a hydrogen atom or an alkyl group, and Rx represents a hydrogen atom or a group which is decomposable and removable by an action of acid.

According to an exemplary embodiment of the present disclosure, the photoresist comprises a second resin having a structure as below:

(II)

In formula (II), $R_0$ represents a hydrogen atom or an alkyl group, and each of $R_1$ to $R_3$ independently represents an alkyl group or a cycloalkyl group, and two of $R_1$ to $R_3$ are combinable to form a monocyclic or polycyclic cycloalkyl group.

According to a fourth aspect of embodiments of the disclosure, there is provided a display panel, comprising a pixel electrode and a common electrode; at least one of the pixel electrode and the common electrode is manufactured by the method as above.

According to an exemplary embodiment of the present disclosure, at least one of the pixel electrode and the common electrode is a comb-shaped electrode.

According to an exemplary embodiment of the present disclosure, the display panel is an ADS type display panel.

According to a fifth aspect of embodiments of the disclosure, there is provided a display panel comprising:
a data line; and
electrodes, which are provided on both sides of the data line and function as shielding electrodes configured to shield the data line from being acted on by interference of an electric field existing in the vicinity of the data line,
wherein the electrodes are manufactured by the method as above.

According to a sixth aspect of embodiments of the disclosure, there is provided a display device comprising the display panel as above.

According to a seventh aspect of embodiments of the disclosure, there is provided an exposure device, comprising:
a light-emitting unit, configured to emit a directional light; and
an optical filter unit, arranged on a light emergent side of the light-emitting unit, and configured to filter the directional light into a first light having a first frequency or a second light having a second frequency.

According to an exemplary embodiment of the present disclosure, the optical filter unit comprises:
a first optical filter portion, configured to filter the directional light into the first light having the first frequency;
a second optical filter portion, arranged to space apart from the first optical filter portion, and configured to filter the directional light into the second light having the second frequency; and
a switching mechanism, configured to switch the first optical filter portion and the second optical filter portion to direct one of the first optical filter portion and the second optical filter portion to face towards the directional light.

According to an exemplary embodiment of the present disclosure, the light-emitting unit comprises:
a light source, configured to emit light;
a reflector, arranged to at least partially surround the light source, and configured to convert the light emitted by the light source into the directional light.

BRIEF DESCRIPTION OF THE DRAWINGS

In order to more clearly illustrate technical solutions of the embodiments of the present disclosure, the drawings required to be used with the description of the embodiments of the present disclosure will be briefly described below. It is apparent that the drawings in the following description are merely some embodiments of the present disclosure. For those skilled in the art, other drawings can be obtained according to these drawings without paying any creative efforts. The accompanying drawings are used to provide a further understanding of the technical solution of embodiments of the disclosure, and constitute a part of the specification, for cooperating with embodiments of the disclosure to explain the technical solution of the embodiments of the disclosure, rather than forming any restriction on the technical solution of the embodiments of the disclosure, wherein.

DETAILED DESCRIPTION

In order to make purposes, technical solution and advantages of embodiments of the present disclosure clearer, the technical solution of the embodiments of the present disclosure will be described clearly and completely in combination with the drawings of the embodiments of the present disclosure. Obviously, the embodiments as described are merely a portion of the embodiments of the present disclosure, rather than all feasible embodiments. Based on the described embodiments of the present disclosure, all other embodiments obtained by those skilled in the art without paying creative labor belong to the scope of the embodiments of the present disclosure.

Unless otherwise defined, the technical or scientific terms used in the disclosure shall be the general meanings understood by those skilled in the art to which the embodiments of the disclosure belong. Words "first", "second" and the like as used in the present disclosure do not indicate any sequence, quantity or importance, but are merely used to distinguish different components. Similarly, similar words such as "a", "one" or "the" indicate the existence of at least one, rather than indicating any quantity limit. Words "comprise(comprising)" or "contain(containing)" and the like mean that the elements or objects appearing before the word and their equivalents may cover the elements or objects appearing after the word and their equivalents, without excluding other elements or objects. Words "connect" or "connection", whether direct or indirect, may cover electrical connection, rather than being limited to any physical or mechanical connection. Words "Up", "down", "left", "right" and the like are merely used to represent relative position relations. When an absolute position of the described object changes, the relative position relation may also change accordingly.

Embodiments of the present disclosure will be described in more detail below with respect to the accompanying drawings. Throughout the drawings, same or similar elements or elements having same or similar function(s) are denoted by like reference numerals. The embodiments described below with reference to the accompanying drawings are exemplary and are only intended for interpreting embodiments of the disclosure and cannot be interpreted as a limitation of the disclosure. For the sake of clarity, various parts in the figures are not drawn to scale. Moreover, some well-known parts may not be shown in the figures.

Many specific details of the embodiments of the present disclosure, such as the structures, materials, dimensions, treatment processes and techniques of the components, are described in the following in order to more clearly understand the embodiments of the present disclosure. It may easily occur to those skilled in the art that, embodiments of the present disclosure may be implemented without these specific details.

Respective dimension and shape of each component in the drawings are only intended to exemplarily illustrate the contents of the disclosure, rather than to demonstrate the practical dimension or proportion of components of a mask, a display panel, an exposure device according to an embodiment of the disclosure.

Figure 1:
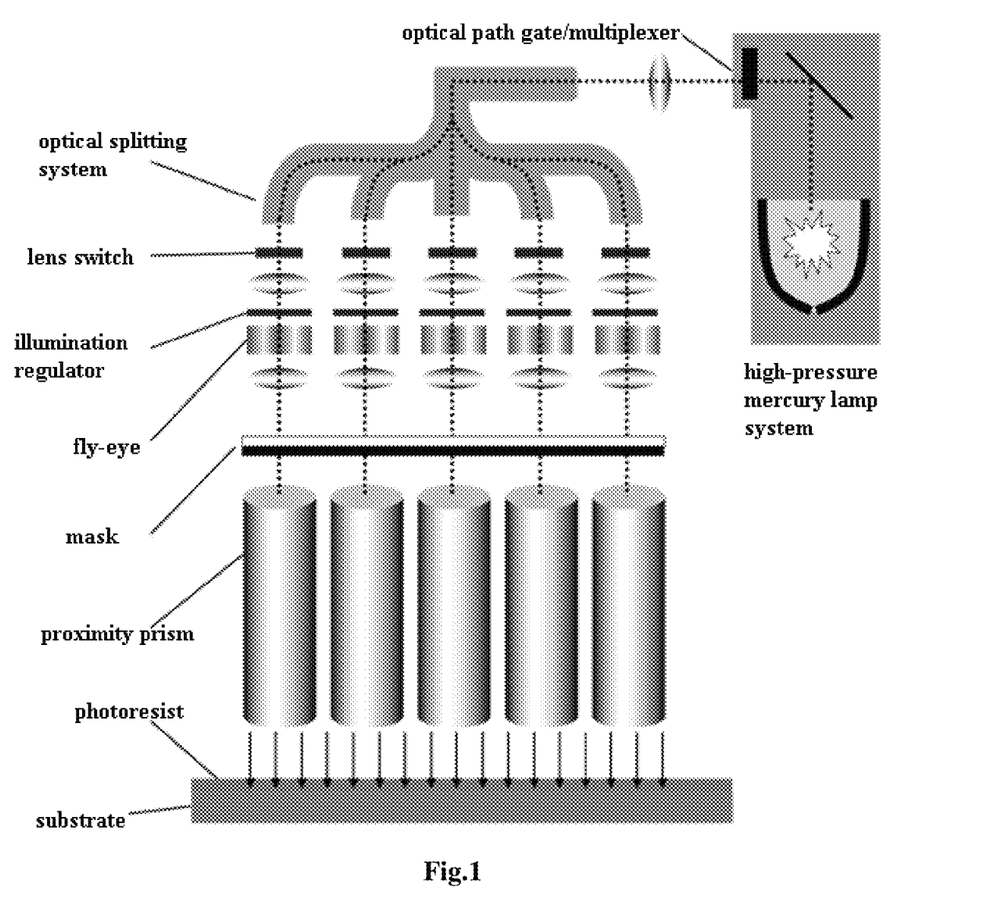
FIG. 1 is a schematic view of an optical path system of an exposure machine.

FIG. 1 is a schematic view of an optical path system of an exposure machine.

An UV exposure machine in relevant art uses a high-pressure mercury lamp as a light source, and an irritation angle of the high-pressure mercury lamp is 360°, and the high-pressure mercury lamp may implement an adjustment of light beams by a reflector having a relatively large surface area, through a relatively long distance between the reflector and the high-pressure mercury lamp, so as to convert the light emitted by the light source into an ideal directional light (i.e., also referring to as "parallel light"); and then, by the directional light, a pattern on a mask, and the like, may be transferred to a photoresist (PR) below the mask in an equal proportion; next, by etching, the pattern already transferred to the photoresist is in turn transferred to a substrate (the example herein specifically refers to a positive photoresist, unless otherwise marked specifically). A radiation range of the high-pressure mercury lamp covers wavebands ranging from the ultraviolet band to the visible light band, with merely a portion of spectrum of UVA UVB bands functioning to be used for ultraviolet exposure, while radiation of other spectral bands functioning to bright out an elevation in ambient temperature; therefore, it is required that the high-pressure mercury lamp should cooperate with a cooling system and an air-conditioning apparatus.

Figure 2:
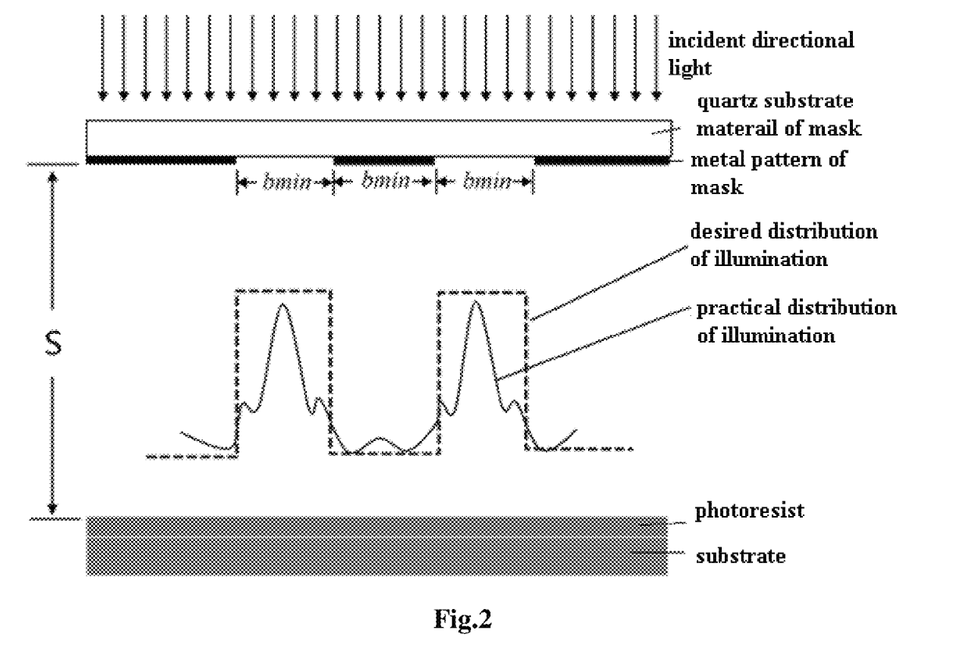
FIG. 2 is a schematic view of a distribution of light intensity in implementing a lithography process with a mask.

In the whole manufacturing process, there are many factors affecting an accuracy in exposure, such as: an accuracy in alignment between the mask and the substrate, a surface flatness of the photoresist, and the like; and among others, an interference caused by light passing through edge(s) of the pattern of the mask is a most critical factor, as illustrated in FIG. 2. Based on theoretical calculation, it can be known that, there is a limit minimum value of a feature size b, with its formula shown as follows:

$$b_{min}=3/2\sqrt{\lambda(S+(1/2)/Z)}$$

Where, $b_{min}$ is a minimum feature size which is achievable by lithography, S is a distance between the mask and the photoresist, $\lambda$, is a wavelength of light for exposure, and Z is a thickness of photoresist.

The feature size here refers to, for example, a material size (i.e., a size of solid portion) or a hollow size (i.e., a size of hollow portion) of the pattern of the mask, both of which have a same physical meaning.

It can be seen that, a resolution of the exposure machine is limited (or the accuracy is limited) because the minimum feature size $b_{min}$ is affected by the interference. In one exposure step, a spacing between light transmission areas may not be designed/set to be smaller than the minimum feature size $b_{min}$, such that intrinsic properties of the exposure machine restrict manufacturing a pattern of smaller critical dimension (CD).

Figure 3:
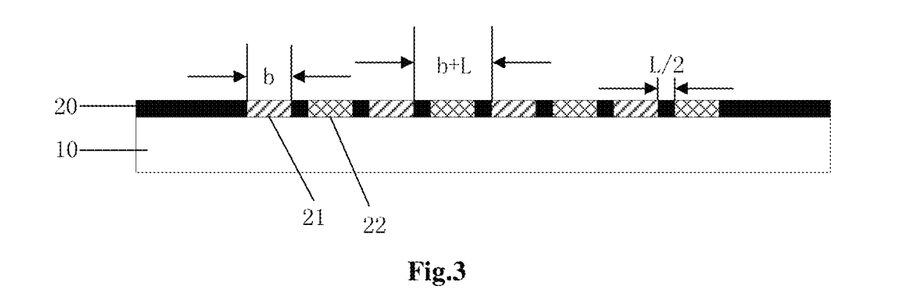
FIG. 3 is a structural schematic view of a mask according to embodiments of the present disclosure.
Figure 4:
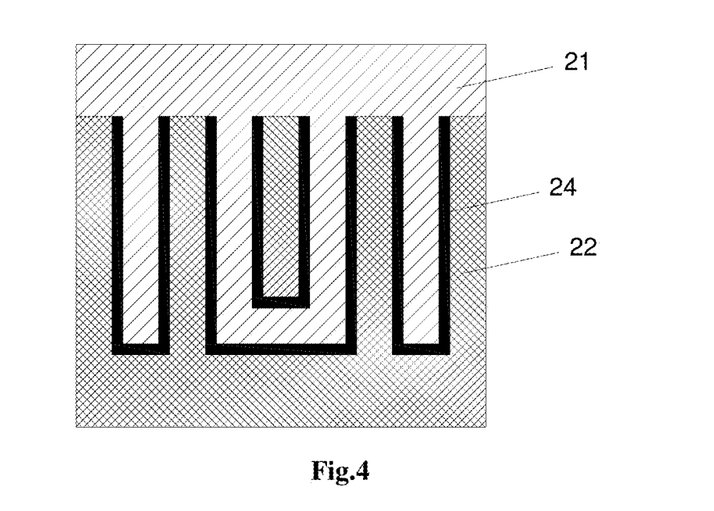
FIG. 4 is a schematic structural top view a mask according to embodiments of the present disclosure.

FIG. 3 is a structural schematic view of a mask according to embodiments of the present disclosure. FIG. 4 is a schematic structural top view a mask according to embodiments of the present disclosure.

According to a general technical concept of embodiments of the disclosure, in one aspect of the embodiment of the disclosure, as illustrated in FIG. 3, a mask is provided, comprising:

a first light transmission area provided with a first optical filter film 21; and a second light transmission area provided with a second optical filter film 22.

And the first optical filter film 21 and the second optical filter film 22 are selected to comprise respective materials through which light of different frequency ranges is optically filtered, respectively (i.e., the light of different frequency ranges may be optically filtered by the first optical filter film 21 and the second optical filter film 22, respectively).

In exemplary embodiments, as illustrated in FIG. 3, the mask further comprises a substrate material (mask substrate) 10 and a mask pattern 20, and as illustrated in FIG. 4, the mask pattern 20 is composed of a light transmission area and a solid area 24, wherein the light transmission area may allow at least light of a specific frequency to pass therethrough, and the light transmission area comprises a first light transmission area provided with the first optical filter film 21 and a second light transmission area provided with the second optical filter film 22, and the first light transmission area and the second light transmission area are spaced part by the solid area 24, facilitating an alternate arrangement of both sections of the first optical filter film 21 and sections of second optical filter film 22. In the present embodiments, since the first light transmission area and the second light transmission area are provided with different optical filter films, respectively, then, respective frequencies of light which may pass through their respective materials are different from each other.

As such, when the mask is used for lithography, for example, above all, a first light which has the first frequency and may pass through the first optical filter film 21 is used for illumination but fails to pass through the second light transmission area provided with the second optical filter film 22; and then, a second light which has the second frequency and may pass through the second optical filter film 22 is used for illumination but fails to pass through the first light transmission area provided with the first optical filter film 21. As such, any one of the first light transmission area and the second light transmission area may function as an interval of the other one of the first light transmission area and the second light transmission area; i.e., any section of a plurality of sections (which are spaced apart from one another) of the first optical filter film 21 functions as an interval between adjacent sections of a plurality of sections (which are spaced apart from one another) of the second optical filter film 22, and any section of a plurality of sections of the second optical filter film 22 functions as an interval between adjacent sections of a plurality of sections of the first optical filter film 21. It should be noted that, next, in a process of lithography with the mask formed as above, since the light of two different frequencies may irradiate through the first optical filter film 21 and the second optical filter film 22 respectively to exposure a target, i.e., two exposures (specifically, first and second exposures) are carried out, (then, exposed areas on the target may be developed and etched so as to form an pattern on the target, and specific size of the pattern thus formed may for example substantially be determined by a line-width of the solid area 24 spacing the first light transmission area 21 and the second light transmission area 22 apart from each other, and the line-width of the solid area 24 is for example determined by a resolution of the pattern of the light transmission area formed on a light-shielding material, by a plotter which forms the light transmission area with laser emitted thereby, and the line-width of the solid area 24 is typically larger than a minimum feature size $b_{min}$ limited by the resolution of the exposure machine). Therefore, the first light transmission area and second light transmission area adjacent to each other may not be used in one and the same exposure. Although both width of and spacing between the exposed areas on the photoresist in each of the two exposures are larger than or equal to $b_{min}$, a comprehensive/composite effect of exposures of the first exposure and the second exposure realizes that a size of a photoresist occlusion area is less than $b_{min}$. After the two exposures are completed, the development and etching are carried out, and a pattern of the target may be obtained. Thus, the interference (e.g., an interference of light at the edge(s) of an exposed pattern as formed above, hereinafter referred to as "edge interference effect") is reduced, and the minimum feature size is actually reduced. As illustrated in FIG. 3, dimension b is $b_{min}$, and L value may be customized. In a process of the first exposure, since sections of the first optical filter film 21 and sections of the second optical filter film 22 are arranged alternately on the mask, an interval area between adjacent two sections of the first optical filter film 21 may be set to be larger than the $b_{min}$ of the exposure machine; after the first exposure, the second exposure is carried out, similarly, an interval area between adjacent two sections of the second optical filter film 22 may also be set to be larger than the $b_{min}$ of the exposure machine.

It can be seen from the above embodiments that, as to the mask according to the embodiments of the disclosure, two light transmission areas (i.e., the first light transmission area and the second light transmission area) which are capable of filtering out light of different frequencies may be provided on the mask, thus the lithography process may be realized by two exposures with light of different frequencies with the mask. As such, it avoids any limitation on the resolution caused by the edge interference effect, and a highly fine slit structure may thus be realized.

In exemplary embodiments, referring to FIG. 4, the first light transmission area and the second light transmission area are arranged to alternate with each other. By providing the first light transmission area and the second light transmission area alternately, respective sections of the first light transmission area and second light transmission area adjacent to each other may not be used in one and the same exposure step, thereby reducing the influence of interference.

In exemplary embodiments, as illustrated with reference to FIG. 4, each of the first light transmission area and the second light transmission area has a comb-shaped portion. As such, each of metal electrodes formed by using the mask may also have a highly fine comb-shaped portion, facilitating improving light transmittance of the display panel.

In exemplary embodiments, if the $b_{min}$ of the corresponding exposure machine is 3 m, then an accuracy of critical dimension (CD) of the mask may reach ±1.5 μm.

For example, each of the first optical filter film 21 and the second optical filter film 22 is one of a semi transmission film and a selective transmission film so as to achieve an effect of optically filtering out light in a certain frequency range.

Figure 5:
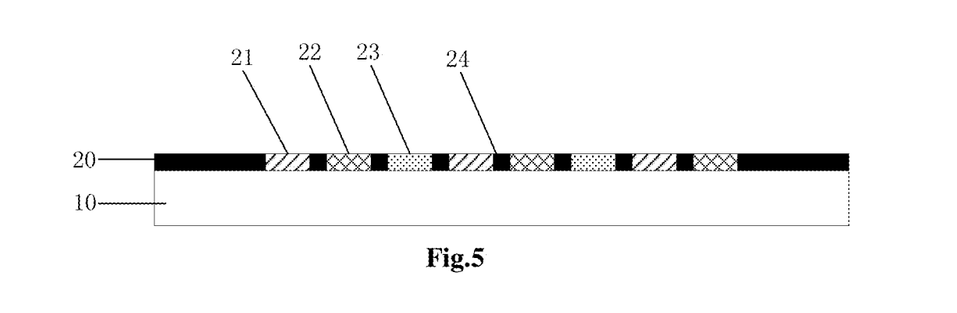
FIG. 5 is a structural schematic view of another mask according to embodiments of the present disclosure.

FIG. 5 is a structural schematic view of another mask according to embodiments of the present disclosure.

As illustrated in FIG. 5, the mask comprises:

a first light transmission area provided with a first optical filter film 21;

a second light transmission area provided with a second optical filter film 22; and a third light transmission area provided with a third optical filter film 23.

And the first optical filter film 21 and the second optical filter film 22 and the third optical filter film 23 comprise respective materials through which light of different frequency ranges is optically filtered, respectively (i.e., the light of different frequency ranges may be optically filtered by the first optical filter film 21, the second optical filter film 22, and the third optical filter film 23, respectively).

It can be seen that, the light transmission area in the present embodiments is divided into three parts, i.e. the first light transmission area, the second light transmission area and the third light transmission area, and they are capable of optically filtering out light with different frequency ranges, respectively. As compared with previous embodiments, such a design may further reduce the minimum feature size, so as to obtain a more precise pattern.

Of course, in addition to the above two types of embodiments, according to practical requirements, in order to further obtain a finer pattern, it is also possible to increase specific number of light transmission areas that are capable of optically filtering out light of different frequencies, without being repeatedly discussed here anymore.

It should be noted that, as to the mask of the present embodiments, it requires to segment the pattern reasonably and to ensure correctness in segmentation. In a design of the segmentation, it should be taken into account that, at a joint of two exposed areas, it should be ensured a uniformity of photoresist after two exposures, so as to prevent a short circuit from being formed in a the pattern subsequently formed due to residue of the photoresist. In addition, in a condition that there may exist large-scale sub-pattern(s) in the pattern to be formed, the large-scale sub-pattern(s) may be exposed in one time; while in a condition that there may exist fine-scale sub-pattern(s), and a fine pattern exceeds the accuracy of the exposure machine, then a design of the segmentation should be carried out for the mask.

Figure 6:
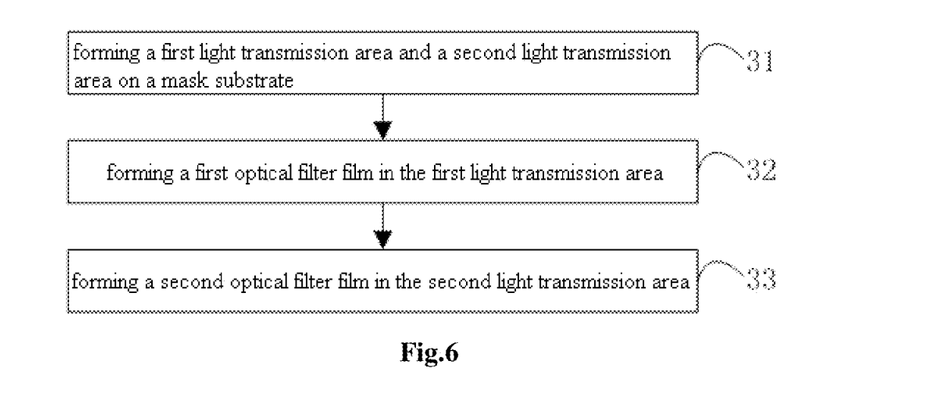
FIG. 6 is a flow chart of a method for manufacturing a mask according to embodiments of the present disclosure.

FIG. 6 is a flow chart of a method for manufacturing a mask according to embodiments of the present disclosure.

Figure 7A:
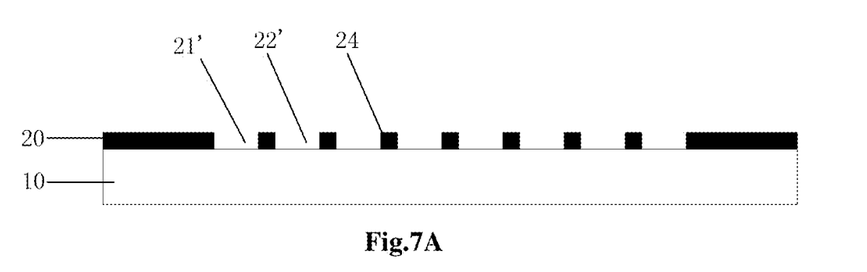
FIG. 7A is a structural schematic view of the mask after light transmission areas are formed on a mask substrate in embodiments of the present disclosure.
Figure 7B:
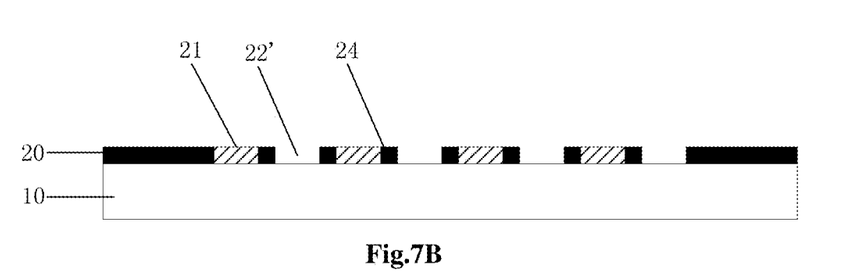
FIG. 7B is a structural schematic view of the mask after an first optical filter film is formed in a first light transmission area in embodiments of the present disclosure.

As illustrated in FIG. 6, the method for manufacturing a mask comprises:

Step 31: forming a first light transmission area 21' and a second light transmission area 22' on a mask substrate 10, as illustrated in FIG. 7A;

Step 32: forming a first optical filter film 21 in the first light transmission area 21', as illustrated in FIG. 7B;

Step 33: forming a second optical filter film 22 in the second light transmission area 22', as illustrated in FIG. 3;

The first optical filter film 21 and the second optical filter film 22 comprise respective materials through which light of different frequency ranges is optically filtered, respectively (i.e., the light of different frequency ranges may be optically filtered by the first optical filter film 21 and the second optical filter film 22, respectively).

It can be seen from the above embodiments that, as to the mask manufactured by the method for manufacturing a mask according to embodiments of the disclosure, it is provided with two light transmission areas capable of optically filtering out light of different frequencies, such that the lithography process may be realized by two exposures with light of different frequencies. As such, it avoids any limitation on the resolution of the pattern thus formed caused by the edge interference effect, and a highly fine slit structure may thus be realized.

In exemplary embodiments, prior to forming a light transmission area, the method further comprises a step of coating a light-shielding material (which may for example be metal chromium (Cr)), on the mask substrate 10. In exemplary embodiments, in the step of forming a light transmission area (comprising, for example, the first light transmission area 21' and the second light transmission area 22') on the mask substrate 10, the pattern of the light transmission area is formed on the light-shielding material, for example, by using a plotter (e.g., a laser machine) with laser emitted thereby. Due to relatively high precision of the plotter, the light transmission area of the mask having highly fine patterns may be better formed.

In exemplary embodiments, at least one of forming a first optical filter film 21 in the first light transmission area 21' and forming a second optical filter film 22 in the second light transmission area 22' comprises:

coating an optical filter material on the mask substrate 10; and removing a portion of the optical filter material in a non-target area and reserving a portion of the optical filter material in a target area.

The target area occupies an area coverage corresponding to the first light transmission area or the second light transmission area; in other words, the expression "corresponding to" here means that the first light transmission area and the second light transmission area are expected to be formed in the target area.

Here, when the first optical filter film 21 is being formed in the above steps, the optical filter material shall be a material for optically filtering out the light which may be filtered out by the first optical filter film 21 accordingly; similarly, when the second optical filter film 22 is being formed in the above steps, the optical filter material shall be a material for optically filtering out the light which may be filtered out by the second optical filter film 22 accordingly.

It should be noted that, a sequence in which the first optical filter film 21 and the second optical filter film 22 are formed may not be specifically limited, and may also fail to affect specific structure of the mask which is finally formed, therefore it is not necessary to define said sequence.

Figure 8:
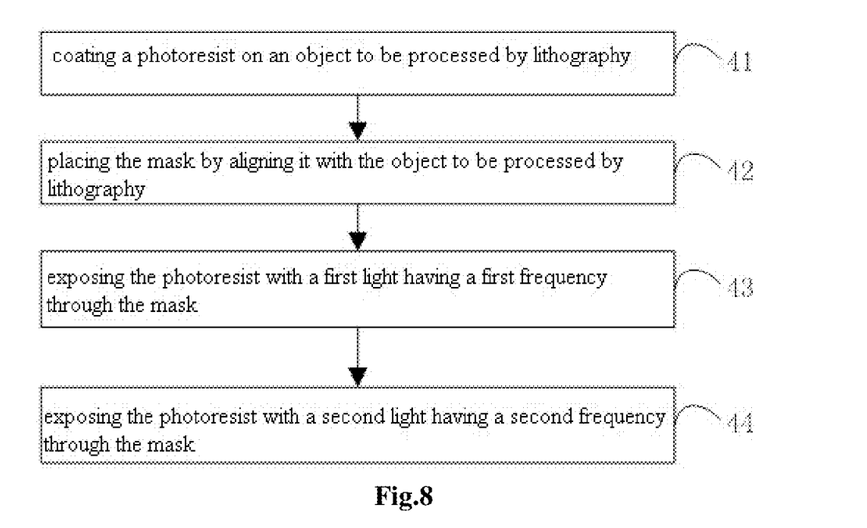
FIG. 8 is a schematic flow chart of a lithography method according to embodiments of the present disclosure.

FIG. 8 is a schematic flow chart of a lithography method using the aforementioned mask according to embodiments of the present disclosure.

Figure 9A:
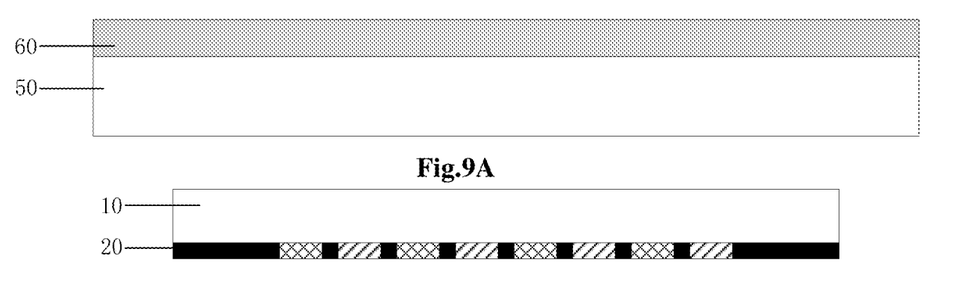
FIG. 9A is a schematic view of coating a photoresist on an object to be processed by lithography, according to embodiments of the present disclosure.

As illustrated in FIG. 8, the lithography method realized according to any embodiment or an arrangement and/or a combination of embodiments of the mask comprises:

Step 41: coating a photoresist 60 on an object 50 to be processed by lithography, as illustrated in FIG. 9A; in exemplary embodiments, the object 50 to be processed by lithography may for example be any object on which a desired pattern is required to be formed by lithography, such as an array substrate, a color filter substrate, and the like.

Figure 9B:
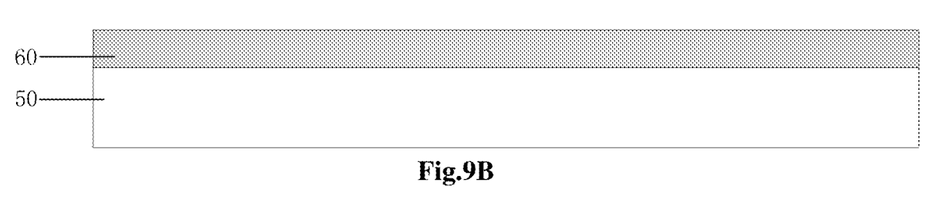
FIG. 9B is a schematic view of placing the mask by aligning it with the object to be processed, according to embodiments of the present disclosure.

Step 42: placing the mask by aligning it with the object to be processed by lithography, as illustrated in FIG. 9B.

Figure 9C:
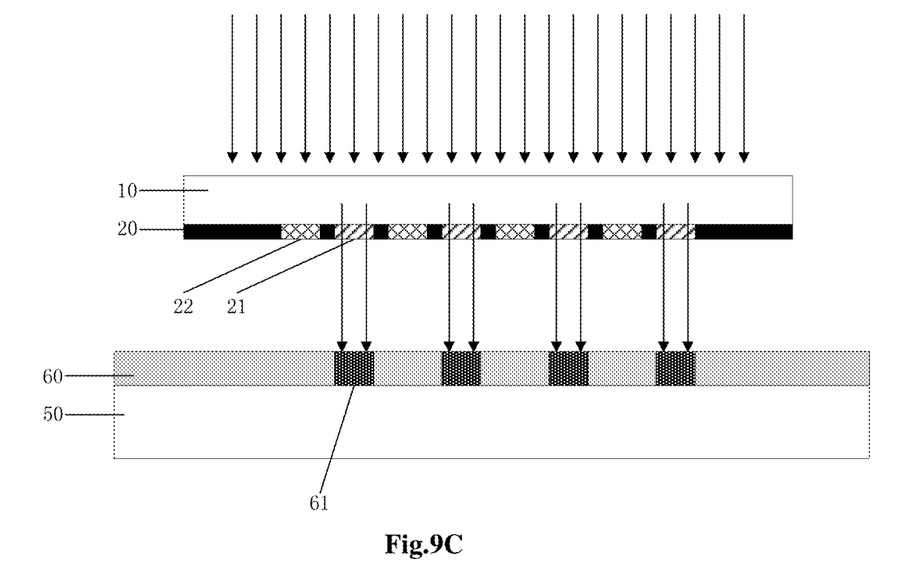
FIG. 9C is a schematic view of exposure of the photoresist with the mask using a first light having a first frequency, according to embodiments of the present disclosure.

Step 43: exposing the photoresist 60 with a first light having a first frequency through the mask, as illustrated in FIG. 9C (the first light having the first frequency may merely pass through the first optical filter film 21, and illuminate the photoresist 60 to form a corresponding first photosensitive area 61).

Figure 9D:
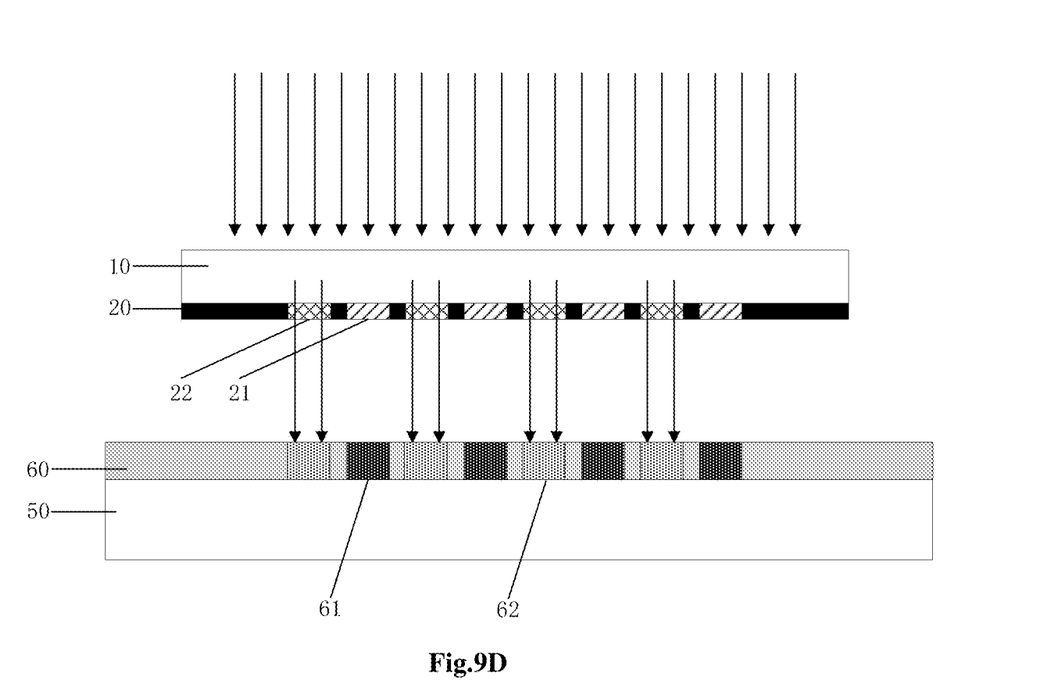
FIG. 9D is a schematic view of exposure of the photoresist with the mask using a second light having a second frequency, according to embodiments of the present disclosure.

Step 44: exposing the photoresist 60 with a second light having a second frequency through the mask, as illustrated in FIG. 9D (the second light having the second frequency may merely pass through the second optical filter film 22, and irradiate the photoresist 60 to form a corresponding second photosensitive area 62).

Figure 9E:
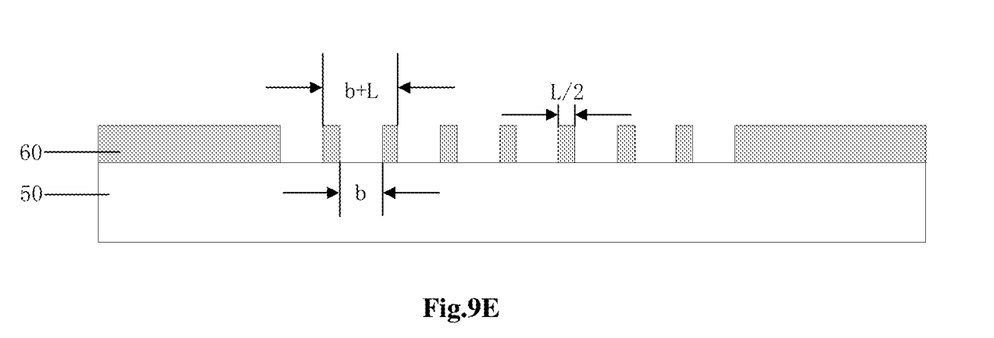
FIG. 9E is a schematic view of obtaining a final pattern of the photoresist, according to embodiments of the present disclosure.

Finally, a pattern of the photoresist may be obtained by development (i.e., cleaning with an alkaline solution so as to peel off an area illuminated by light), as illustrated in FIG. 9E; and an etching process may further be carried out so as to form a desired pattern on the object 50 to be processed by lithography.

Figure 10:
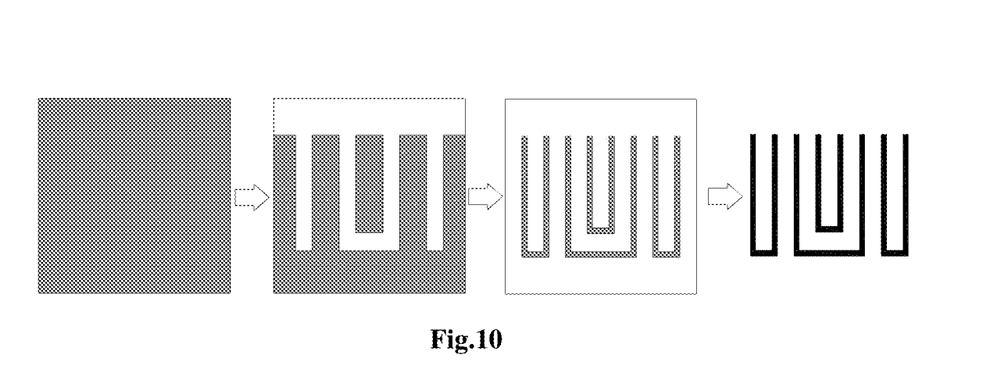
FIG. 10 is a schematic view of processes of the lithography from a top view perspective with the mask as illustrated in FIG. 4 as an example.

FIG. 10 illustrates a pattern formed by various schematic steps of the process of the aforementioned lithography method as viewed from a top view perspective, by taking the mask as illustrated in FIG. 4 as an example. Among others, from left to right, there are illustrated: coating the photoresist→first exposure→second exposure→a pattern formed by development and final etching.

It can be seen from the above embodiments that, by using the lithography method carried out with the mask according to the embodiments of the present disclosure, since the mask is provided with two types of light transmission areas which may filter out light of different frequencies, then, merely with one alignment between the mask and a base stage, it is possible to implement and completely the lithography process by two exposures carried out by using light having different frequencies, so as to form the pattern of the photoresist, various portions of which are distributed alternately. As such, it avoids limitation on resolution caused by interference, so as to obtain a highly fine slit structure on the object to be processed by lithography.

It can be known that, an appropriate spacing L can be selected as required. For example, in a condition that $0<L<6$ μm, a line-width that breaks through the resolution limit may be obtained, and there will be no edge interference effect in the exposure process. As illustrated in FIG. 9E, as long as it is set that $L>0$ in embodiments of the present disclosure, in fact, a minimum spacing between two adjacent hollow portions of the pattern of the mask is $b_{min}+L/2>3$ such that there will be no edge interference of light. For example, in a condition that $L=2$ lines each having a line—with of 1 μm (i.e., L/2) may be formed when the $b_{min}$ is 3 as illustrated in FIG. 9E.

In the present example, by taking a positive photoresist as an example, in order to realize highly fine line-width of metal lines, in a condition that fine patterns are formed according to present solution, it may be ensured that one of the hollow portion and the solid portion may be of high accuracy, as illustrated in FIG. 9E, an etching of solid line(s) may realize a dimensional accuracy less than $b_{min}$; however, as to the hollow portion adjacent thereto, merely the minimum feature size $b_{min}$ which is allowed by relevant art may be achieved both in the first exposure and in the second exposure.

As illustrated in FIG. 4 and FIG. 10, the line-width of the solid portion of the pattern of the target is less than $b_{min}$. In order to achieve a fine etching, a complete/finalized pattern of the mask may be designed to be a nested structure of the first optical filter film and the second optical filter film.

In the first exposure, merely at the first optical filter film, light will pass therethrough; and at that time, both width of and spacing between the exposed areas on the photoresist are larger than or equal to $b_{min}$. Then, the second exposure follows immediately, and merely at the second optical filter film, light will pass therethrough, both width of and spacing between the exposed areas on the second optical filter film are larger than or equal to $b_{min}$. However, a comprehensive/composite effect of exposures of the first exposure and the second exposure realizes that a size of a photoresist occlusion area is less than $b_{min}$. After the two exposures are completed, the development and etching are carried out, and a pattern of the target may be obtained.

In addition, when calculating the $b_{min}$, a wavelength of light used for exposure is also one of the factors influencing the exposure, then, once an optical filter film used for exposure is switched from the first optical filter film to the second optical filter film, then corresponding $b_{min}$ value will also change. Therefore, provided that respective minimum feature sizes corresponding to the first optical filter film and the second optical filter film are $b_{min\_}A$ and $b_{min\_}B$, if $b_{min\_}A$ is larger than $b_{min\_}B$, then $b_{min\_}A$ is set to function as $b_{min}$.

And also provided that respective minimum feature sizes corresponding to the first optical filter film and the second optical filter film are $b_{min\_}A$ and $b_{min\_}B$, if $b_{min\_}A$ is smaller than $b_{min\_}B$, then $b_{min\_}B$ is set to function as $b_{min}$. In other words, a relatively larger one of respective minimum feature sizes corresponding to the first optical filter film and the second optical filter film is taken as the final $b_{min}$ value of the mask, such that an accuracy may be ensured in a condition of switching between the first optical filter film and the second optical filter film.

In some embodiments, the photoresist comprises a first resin having a structure as below:

(I)

In formula (I), Xa represents a hydrogen atom or an alkyl group, and Rx represents a hydrogen atom or a group which is decomposable and removable by an action of acid.

In exemplary embodiments, specific structures of the first resin may for example comprise following structures:

1

2

-continued

3

4

5

6

In some other embodiments, the photoresist comprises a second resin having a structure as below:

(II)

In formula (II), $R_0$ represents a hydrogen atom or an alkyl group, and each of $R_1$ to $R_3$ independently represents an alkyl group or a cycloalkyl group, and two of $R_1$ to $R_3$ are combinable to form a monocyclic or polycyclic cycloalkyl group.

In exemplary embodiments, specific structures of the second resin may for example comprise following structures:

7

8

9

It may be known that, in some optional embodiments, the photoresist may comprise both the first resin and the second resin.

The photoresist in aforementioned embodiments may all be high contrast non-linear photoresists, since the second exposure may have more or less (i.e. somewhat) effects on the first exposure pattern, so it is necessary to use the high contrast non-linear photoresist to absorb weak light from adjacent exposure, without forming pattern thereby, and in turn to form the pattern of the photoresist which is more regular after a subsequent development, so as to ensure the precision of the highly fine lit structure.

In embodiments of the present disclosure, a display panel is also provided, which comprises a pixel electrode and a common electrode. And at least one of the pixel electrode and the common electrode is manufactured by aforementioned lithography method according to any embodiment or an arrangement and/or a combination of embodiments. As such, in a condition that the electrodes of the display panel are manufactured by the lithography method, these electrodes have relatively high precision, facilitating improvement in light transmittance.

In exemplary embodiments, at least one of the pixel electrode and the common electrode is a comb-shaped electrode. The comb-shaped electrode is manufactured by the lithography method, which can obtain a highly fine slit structure and the electrodes having relatively high precision.

Light transmittance is an important optical quality of the display panel. In a LCD in relevant art, merely about 5% of the light may pass through the display. It is an important measure to improve the light transmittance for enhancing competitiveness of products and reducing power consumption of products, and conventional methods for implementing such comprise: optimization of design without storage capacitance, use of high-transmission liquid crystal, reduced black matrix (BM), etc. As to products of ADS (Advanced Super Dimension Switch) type display mode, a W/S ratio is optimized for a gap structure of pixel electrodes, which may significantly improve the transmittance of the panel, W refers to a line-width of metal lines, and S refers to the spacing between adjacent metal lines. Therefore, in a condition that the display panel is an ADS type display panel, electrodes of the ADS type display panel are manufactured by the lithography method, facilitating obtaining a highly fine slit structure, and in turn improving the light transmittance of the display panel.

In embodiments of the present disclosure, another display panel is further provided, which comprises: a data line (e.g., SD signal line); and electrodes, which are provided on both sides of the data line and function as shielding electrodes configured to shield the data line from being acted on by interference of an electric field existing in the vicinity of the data line; and the electrodes are manufactured by the above lithography method according to any embodiment or an arrangement and/or a combination of embodiments.

Since there exist an interference electric field in the vicinity of the data line (e.g., SD signal line) when the display panel operates, in order to mitigate an influence of the interference electric field on data communicating via the data line, then, shielding electrodes may typically be provided on both sides of the data line, and the width of the shielding electrodes may typically be relative wide, which will affect the light transmittance of the display panel. Therefore, the shielding electrodes are manufactured by using aforementioned lithography method as above, facilitating decreasing sizes of the shielding electrodes, and improving aperture ratio, and in turn enhancing light transmittance of the display panel.

In embodiments of the present disclosure, a display device is further provided, comprising the display panel according to any embodiment or an arrangement and/or a combination of embodiments.

It should be noted that, the display device in the embodiments may for example be any product or component having display function, such as electronic paper, mobile phone, tablet computer, television, laptop computer, digital photo frame, navigator, etc.

Figure 11:
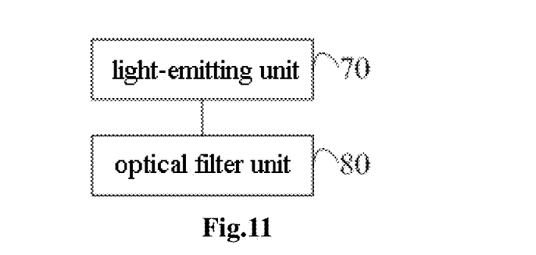
FIG. 11 is a structural schematic view in the form of a block diagram of an exposure device according to the embodiment of the present disclosure.

FIG. 11 is a structural schematic view in the form of a block diagram of an exposure device according to the embodiments of the present disclosure.

As illustrated in FIG. 11, the exposure device comprises:
a light-emitting unit 70, configured to emit a directional light; and
an optical filter unit 80, arranged on a light emergent side of the light-emitting unit 70, and configured to filter the directional light into a first light having a first frequency or a second light having a second frequency.

In exemplary embodiments, when it is desired to utilize the first light transmission area to implement and complete an exposure, the optical filter unit 80 filters the directional light emitted by a light source into the first light having the first frequency; and when it is desired to utilize the second light transmission area to implement and complete an exposure, the optical filter unit 80 filters the directional light emitted by a light source into the second light having the second frequency. Here, the optical filtering of light refers to a preliminary optical filtering, since the light source (e.g., high-pressure mercury lamp) has its radiation range covering wavebands ranging from the ultraviolet band to the visible light band, with merely a portion of spectrum of UVA UVB bands functioning to be used for ultraviolet exposure, and the preliminary optical filtering may better cooperate and coordinate with a subsequent exposure step.

It can be seen from the above embodiments that, as to the exposure device according to the embodiments of the disclosure, a preliminary optical filtering treatment may be carried out by the optical filter unit, on the directional light emitted from the light-emitting unit, preventing any interference light from passing through the light transmission area on which the exposure step is expected to be implemented (for example, when the first light transmission area is used for exposure, there will be interference light (or referred to as "impurity light") passing through the second light transmission area and exposing a portion of the photoresist which portion would have not be exposed in this step), and thus avoiding affecting the exposure effect.

Figure 12A:
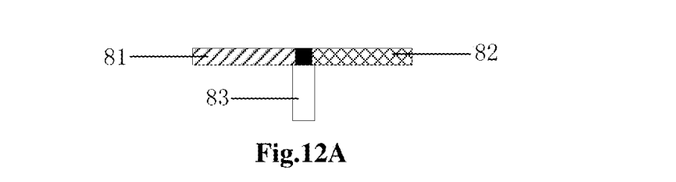
FIG. 12A is a structural schematic view of an optical filter unit according to embodiments of the present disclosure.
Figure 12B:
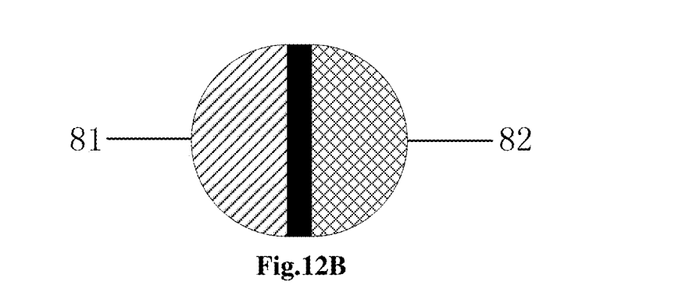
FIG. 12B is a structural schematic top view of an optical filter unit according to embodiments of the present disclosure.

In exemplary embodiments, as illustrated in FIGS. 12A and 12B, the optical filter unit 80 comprises:

a first optical filter portion 81, configured to filter the directional light into the first light having the first frequency;

a second optical filter portion 82, which is for example arranged to space apart from the first optical filter portion 81, and configured to filter the directional light into the second light having the second frequency; and a switching mechanism 83, configured to switch the first optical filter portion 81 and the second optical filter portion 82 (e.g., such switching is implemented by a mechanical movement like rotation) to direct one of the first optical filter portion 81 and the second optical filter portion 82 to face towards the directional light.

As illustrated in FIG. 12A and FIG. 12B, the first optical filter portion 81 and the second optical filter portion 82 are respectively formed by an optical filter material in the form of hemispherical shape, and both of them are spliced together; and at a central axis position of a complete spherical shape which would have been formed by splicing between the first optical filter portion 81 and the second optical filter portion 82, there is additionally provided the switching mechanism 83 which is configured to, for example by a rotation of its own, switch respective positions of both the first optical filter portion 81 and the second optical filter portion 82. Specifically, when it is desired to use the first optical filter portion 81 to complete an optical filtering, the switching mechanism 83 may adjust the first optical filter portion 81 to face towards the directional light by rotating; and when it is desired to use the second optical filter portion 82 to complete an optical filtering, the switching mechanism 83 may adjust the second optical filter portion 82 to face towards the directional light by further rotating (for example, by further rotating) 180°.

In exemplary embodiments, the light-emitting unit 70 comprises:

a light source, configured to emit light; and a reflector, for example arranged to at least partially surround the light source, and configured to convert the light emitted by the light source into the directional light.

Since the light source approximates (i.e., is considered similar to) a point light source, then a parabolic reflector is required to realize the directional light (i.e., parallel light), and the optical filter unit 80 may be designed to be located at a light outlet of the directional light.

In exemplary embodiments, after the optical filter unit 80 selectively transmits light of a specific frequency, then a light intensity of exposure may be correspondingly reduced, but a cross-linking reaction during the exposure of the photoresist is mainly related to an overall light energy as received, therefore, the light intensity of exposure may be guaranteed by increasing an exposure time or by increasing an illumination intensity of the mercury lamp.

In exemplary embodiments, as to the exposure device according to the embodiments of the present disclosure, in addition to the optical filter unit 80 thereof, other structures thereof have the same structure as those in an exposure machine in relevant art without any change.

As compared with the relevant art, based on the above technical solutions, the mask and the method for manufacturing the same, the lithography method, the display panel, and the exposure device according to the embodiments of the present disclosure, may at least have beneficial effects as follows:

It can be seen from the above that, the mask according to the embodiments of the disclosure may implement and complete the lithography process by providing therein two light transmission areas that are capable of optically filtering out light of different frequencies, respectively, such that the lithography process may be completed by admitting light of different frequencies to pass therethrough respectively in two exposures, avoiding any limitation on the resolution caused by interference and in turn realizing a highly fine slit structure.

The mask manufactured by the method for manufacturing a mask according to the embodiments of the disclosure has two light transmission areas capable of optically filtering light of different frequencies respectively, such that the lithography process may be completed by admitting light of different frequencies to pass therethrough respectively in two exposures, avoiding any limitation on the resolution caused by interference and in turn realizing a highly fine slit structure.

As to the lithography method implemented by using the mask according to the embodiments of the disclosure, since the mask is provided with two light transmission areas capable of optically filtering light of different frequencies respectively, then merely with one alignment between the mask and a base stage, the lithography process may be completed by admitting light of different frequencies to pass therethrough respectively in two exposures, so as to form the pattern of the photoresist, various portions of which are distributed alternately, avoiding any limitation on the resolution caused by interference and in turn realizing a highly fine slit structure on the object to be processed by lithography.

As to the display panel and display device according to the embodiments of the disclosure, the electrodes therein are manufactured by the lithography method, facilitating increasing the light transmittance of both the display panel and display device.

As to the exposure device according to the embodiments of the disclosure, it carries out a preliminary optically filtering treatment by the optical filter unit thereof by using the directional light of the light emitting unit thereof, preventing any interference light from passing through the light transmission area on which the exposure step is expected to be implemented, and thus avoiding affecting the exposure effect.

It should be noted that, in the drawings, the dimensions of layers and areas may be exaggerated for the sake of clarity. And it can be understood that in a condition that a component or layer is referred as being "above/on" another component or layer, it may be directly located on said another component or layer, or there may exist an intermediate layer. In addition, it can be understood that in a condition that a component or layer is referred to as being "below/under" another component or layer, it may be directly located under said another component or layer, or there may exist more than one intermediate layer or element. In addition, it can be understood that in a condition that a layer or component is referred to as being "between" two layers or two components, it is, for example, the one and only layer between said two layers or two components, or there may exist more than one intermediate layer or component Similar reference numerals throughout the disclosure indicate similar elements.

The above are merely exemplary embodiments of the present disclosure and are not used to limit the present disclosure. For those skilled in the art, embodiments of the present disclosure may have various changes and variations. Any modification, equivalent replacement, improvement, and the like made within the spirit and principle of the embodiments of the present disclosure shall fall within the scope of protection of the embodiments of the present disclosure, as defined in the following claims.

What is claimed is:

1. A mask, comprising:
   a first light transmission area provided with a first optical filter film;
   a second light transmission area provided with a second optical filter film; and
   a solid area spacing the first light transmission area and the second light transmission area apart,
   wherein, the first optical filter film and the second optical filter film comprise respective materials through which light of different frequency ranges is optically filtered, respectively;
   wherein each of the first light transmission area and the second light transmission area has a comb-shaped portion, wherein a comb-shaped portion of the first light transmission area is engaged with a comb-shaped portion of the second light transmission area; and
   wherein sections of a comb-shaped portion of the first light transmission area and sections of a comb-shaped portion of the second light transmission area are arranged to alternate with each other, and the solid area has an equal line-width along a direction in which the sections of the comb-shaped portion of the first light transmission area and the sections of the comb-shaped portion of the second light transmission area are arranged to alternate with each other.

2. The mask according to claim 1, wherein each of the first optical filter film and the second optical filter film is one of a semi transmission film or a selective transmission film.

3. A lithography method using the mask according to claim 1, comprising:
   coating a photoresist on an object to be processed by lithography;
   placing the mask by aligning it with the object to be processed by lithography;
   exposing the photoresist with a first light having a first frequency through the mask; and
   exposing the photoresist with a second light having a second frequency through the mask;
   wherein in the mask, only the first optical filter film is permeable to the first light having the first frequency, and only the second optical filter film is permeable to the second light having the second frequency.

4. The method according to claim 3, wherein the photoresist comprises a first resin having a structure as below:

(I)

wherein in formula (I), Xa represents a hydrogen atom or an alkyl group, and Rx represents a hydrogen atom or a group which is decomposable and removable by an action of acid.

5. The method according to claim 4, wherein the photoresist comprises a second resin having a structure as below:

(II)

wherein in formula (II),
$R_1$ represents a hydrogen atom or an alkyl group, and each of $R_1$ to $R_3$ independently represents an alkyl group or a cycloalkyl group, and two of $R_1$ to $R_3$ are combinable to form a monocyclic or polycyclic cycloalkyl group.

6. A display panel, comprising a pixel electrode and a common electrode, at least one of the pixel electrode or the common electrode being manufactured by the method according to claim 3.

7. The display panel according to claim 6, wherein at least one of the pixel electrode or the common electrode is a comb-shaped electrode.

8. The display panel according to claim 6, wherein the display panel is an ADS type display panel.

9. A display device comprising the display panel according to claim 6.

10. A display panel comprising:
    a data line; and
    electrodes, which are provided on both sides of the data line and function as shielding electrodes configured to shield the data line from being acted on by interference of an electric field existing in the vicinity of the data line,
    wherein the electrodes are manufactured by the method according to claim 3.

11. An exposure device arranged to expose an object through the mask according to claim 1, comprising:
    a light-emitting unit, configured to emit a directional light; and
    an optical filter unit, arranged on a light emergent side of the light-emitting unit, and configured to filter the directional light into a first light having a first frequency or a second light having a second frequency.

12. The exposure device according to claim 11, wherein the optical filter unit comprises:
    a first optical filter portion, configured to filter the directional light into the first light having the first frequency;
    a second optical filter portion, arranged spaced apart from the first optical filter portion, and configured to filter the directional light into the second light having the second frequency; and
    a switching mechanism, configured to switch the first optical filter portion and the second optical filter portion to direct one of the first optical filter portion or the second optical filter portion to face towards the directional light.

13. The exposure device according to claim 11, wherein the light-emitting unit comprises:
    a light source, configured to emit light; and
    a reflector, arranged to at least partially surround the light source, and configured to convert the light emitted by the light source into the directional light.

14. A method for manufacturing a mask, comprising:
    forming a first light transmission area and a second light transmission area on a mask substrate;

forming a first optical filter film in the first light transmission area; and forming a second optical filter film in the second light transmission area, wherein the first optical filter film and the second optical filter film comprise respective materials through which light of different frequency ranges is optically filtered, respectively;

wherein the mask comprises a solid area spacing the first light transmission area and the second light transmission area apart;

wherein each of the first light transmission area and the second light transmission area has a comb-shaped portion, wherein a comb-shaped portion of the first light transmission area is engaged with a comb-shaped portion of the second light transmission area; and wherein sections of a comb-shaped portion of the first light transmission area and sections of a comb-shaped portion of the second light transmission area are arranged to alternate with each other, and the solid area has an equal line-width along a direction in which the sections of the comb-shaped portion of the first light transmission area and the sections of the comb-shaped portion of the second light transmission area are arranged to alternate with each other.

15. The method according to claim 14, wherein at least one of forming a first optical filter film in the first light transmission area or forming a second optical filter film in the second light transmission area comprises:

coating an optical filter material on the mask substrate; and removing a portion of the optical filter material in a non-target area and reserving a portion of the optical filter material in a target area;

wherein the target area occupies an area corresponding to the first light transmission area or the second light transmission area.

* * * * *